(12) United States Patent
Maier

(10) Patent No.: US 12,512,829 B2
(45) Date of Patent: Dec. 30, 2025

(54) SAFE SHUTDOWN OF AN INVERTER

(71) Applicant: ZF Friedrichshafen AG, Friedrichshafen (DE)

(72) Inventor: Robert Maier, Neudrossenfeld (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 23 days.

(21) Appl. No.: 18/583,618

(22) Filed: Feb. 21, 2024

(65) Prior Publication Data
US 2024/0283438 A1    Aug. 22, 2024

(30) Foreign Application Priority Data
Feb. 21, 2023  (DE) .................. 102023201507.2

(51) Int. Cl.
| | |
|---|---|
| *H02M 1/36* | (2007.01) |
| *H03K 17/06* | (2006.01) |
| *H03K 17/0812* | (2006.01) |
| *H03K 17/082* | (2006.01) |

(52) U.S. Cl.
CPC .......... *H03K 17/0822* (2013.01); *H02M 1/36* (2013.01); *H03K 17/063* (2013.01); *H03K 17/08122* (2013.01)

(58) Field of Classification Search
CPC . H02M 1/36; H03K 17/063; H03K 17/08122; H03K 17/0822
USPC ........................................ 327/427, 430, 581
See application file for complete search history.

(56) References Cited

U.S. PATENT DOCUMENTS

2022/0302867 A1    9/2022  Prasad et al.
2024/0317061 A1*   9/2024  Fernandez ............. H02H 3/087

OTHER PUBLICATIONS

German Office Action in Corresponding German Application No. DE 10 2023 201 507.2, dated Jan. 19, 2024 (12 pages).
Rodrigues, R. et al., "Optimized Method for Protection of SiC JFET Based Converters Against Failure of Auxiliary Power Supply" 2019 *IEEE Energy Conversion Congress and Exposition*, 2019, pp. 5700-5706; doi:10.1109/ECCE.2019.8912769, (8 pages).
Giannoutsos, S., et al., "A Gate Drive Circuit for Normally-On SiC JFETs with Self-Protection Functions against Overcurrent and Shoot-Through Fault Conditions" *015 IEEE 15th International Conference on Environment and Electrical Engineering (EEEIC)*, 2015, pp. 851-859 doi: 10.1109/EEEIC.2015.7165275; (10 pages).
Guédon, F., et al., "Gate Drive for SiC JFETs With Protection Against Normally-On Behavior Induced Fault" *IET Electronics Letters*, vol. 47, 2011, No. 6, pp. 375-377 (4 pages).

* cited by examiner

*Primary Examiner* — William Hernandez
(74) *Attorney, Agent, or Firm* — Crowell & Moring LLP

(57) ABSTRACT

An output stage for an inverter for driving an electrical machine includes a half-bridge containing a current valve embodied as a JFET. The current valve is configured to be controlled by a driver. The output stage comprises a cutout circuit for opening the current valve when the driver has no supply voltage, wherein the cutout circuit includes a capacitor and a diode, which are connected in series between a gate terminal and a source terminal of the current valve, an additional JFET for bypassing the diode, and a drive, which keeps a voltage between a gate terminal and a source terminal of the additional JFET small enough to close the additional JFET as long as a supply voltage of the driver is large enough.

11 Claims, 3 Drawing Sheets

SAFE SHUTDOWN OF AN INVERTER

CROSS-REFERENCE TO RELATED APPLICATION

This application claims priority to German Application No. 10 2023 201 507.2, filed on Feb. 21, 2023, the entirety of which is hereby fully incorporated by reference herein.

FIELD

The present disclosure relates to an electrical inverter, in particular for driving an electrical machine. More specifically, the present disclosure relates to shutting down the inverter when a supply voltage required for operating the machine in a controlled manner is lost.

BACKGROUND

A motor vehicle comprises for propulsion an electrical machine, which can be operated from an electrical energy store by an inverter. For this purpose, the inverter provides the machine with three alternating currents, each offset in phase by 120°. A torque provided by the machine or a rotational speed that it adopts can be regulated by controlling the alternating currents.

The inverter typically comprises an output stage containing three half-bridges. A half-bridge comprises two current valves connected in series between terminals of the energy store, with a terminal of the electrical machine connected between said current valves. A driver alternately opens and closes the current valves at a variable duty cycle in order to provide a predetermined alternating current. Semiconductors such as IGBTs or FETs are normally used as the current valves. To avoid a short circuit, it is important to ensure that the current valves are not both closed at the same time.

SUMMARY

A correct drive for the current valves cannot be guaranteed if a supply voltage of the driver is too low. If normally-on current valves (current valves which are closed in the absence of a drive) are used, for example JFETs, then in the event of a voltage fault in which the supply voltage fails, these must be kept open actively by a separate circuit.

It has been proposed to safeguard a normally-on current valve by a capacitor, which is charged during normal operation, and provides energy to close the current valve in the event of a voltage fault. An additional JFET can be used to switch between normal and fault operating mode. Known circuits, however, restrict the current-valve drive to negative voltages, which means that the closed state cannot be achieved by a positive voltage. Furthermore, the dimensioning of known circuits for rapid and safe opening of the current valve in the event of a voltage fault can be problematic.

An object of the present disclosure is to provide improved technology for safe shutdown of an inverter having a normally-on current valve. This object is achieved by the subject matter of the present disclosure. The present disclosure also presents preferred embodiments.

An output stage for an inverter, in particular for driving an electrical machine, comprises a half-bridge containing a normally-on current valve, for example in the form of a JFET. The current valve is configured to be controlled by a driver.

According to a first aspect of the present disclosure, the output stage comprises a cutout circuit for opening the current valve when the driver has no supply voltage; wherein the cutout circuit comprises: a capacitor and a diode, which are connected in series between a gate terminal and a source terminal of the current valve; an additional JFET for bypassing the diode; and a drive, which keeps a voltage between a gate terminal and a source terminal of the additional JFET low enough to close the additional JFET as long as a supply voltage of the driver is large enough.

The cutout circuit can have a simple and space-saving design, and allows safe opening of the current valve without requiring an auxiliary voltage that must be derived, for instance, from an operating voltage from which the machine is supplied. As a result, it is advantageously possible to use a normally-on current valve, which is closed in the absence of a drive, but which has other advantages, in particular low conduction loss, low switching loss or a short switching time. The cutout circuit can be resilient to electrical or mechanical stresses. The shutdown of the output stage or opening of the current valve can be performed very quickly in the event of a voltage fault. Functional safety of the inverter can be guaranteed even using a normally-on current valve.

The output stage usually comprises two current valves, which are connected together in series to form a half-bridge, at which a voltage can be provided by driving the current valves alternately. In order to provide different voltages, the output stage can comprise a plurality of half-bridges, each containing two current valves. A typical electrical machine has three phases, for which individual voltages must be provided.

It can suffice to equip only one of the current valves of a half-bridge with the described cutout circuit in order to prevent a short circuit by the output stage in the event of a voltage fault. It is also possible as an option to set up a plurality of mutually independent cutout circuits.

A time during which the current valve can be kept open safely can be set by suitable dimensioning of the capacitor. This time can be adapted to another time, within which another safety measure can take effect, for example disconnecting the operating voltage from the output stage by a protective device, which can comprise a relay or a semiconductor arrangement. In the event of a voltage fault in which the magnitude of the supply voltage of the driver is too small, the capacitor is discharged largely just by a small leakage current through the current valve, and therefore it only has to have a low capacitance in order to keep the current valve open long enough. In a typical usage on board a motor vehicle, a capacitance of just a few 100 μF can be sufficient to keep the current valve open over several seconds. The capacitor is typically charged only to a few tens of Volts.

In a preferred embodiment, the current valve can be closed by a negative voltage at its gate terminal. In other words, the current valve can preferably be closed by a positive voltage at the source terminal with respect to the gate terminal. Hence a closed state of the current valve can be induced actively instead of letting it be caused by an absent drive. Thus, better control of the current valve is possible, so that the inverter can convert DC voltage of the operating voltage into an AC voltage more precisely or with lower losses.

It is also preferred that the current valve can be produced in silicon carbide technology (SiC). SiC semiconductors can provide better performances than semiconductors in silicon technology (Si), for example in terms of switching speed, electrical breakdown strength or maximum operating temperature. Well-designed components are available in particular for JFETs in SiC technology.

A resistor can be provided in parallel with the capacitor. If the capacitor has discharged by a predetermined amount, in particular from the safe state in the event of a voltage fault, the current valve can be closed slowly by the resistor. A DC-link capacitor, which buffers the operating voltage of the output stage, can thereby be discharged in a controlled manner through the current valve. It is assumed here that an energy store for providing the operating voltage, in particular a battery, is already disconnected from the DC-link capacitor by other means at this point in time. This can reduce a hazard posed by any remaining voltage in the DC-link capacitor. The current valve can be connected to passive or active cooling, which can comprise a fluid circuit, so that heat produced during the discharge can be dissipated safely.

In a first variant, the drive is performed on the basis of a signal, which indicates a sufficient supply voltage of the driver. If the signal is meant to have a high potential when the supply voltage is sufficient, then it can be inverted for the drive. Such a signal can be provided by another component, for instance by the driver, and is sometimes called "power good" or the like. An opposite signal indicating that the supply voltage is not sufficient is also known as UVLO. Depending on the design or configuration, the signal can be active at a high level or a low level, and correspondingly inactive at the other level in each case.

The current valve can be comprised by a control module that provides the signal. The control module can comprise two current valves, which are connected in series in order to form a half-bridge. The control module can be configured to release generated heat to a surrounding structure, which can comprise a passive or active heatsink, for example. An active heatsink can be part of a fluid-assisted cooling system, which can cool with or without the fluid changing phase.

The signal can be taken to a source terminal of the current valve by a resistor. An interface is preferably provided, at which the signal can be made available. The interface can be connected to the source terminal by the resistor. The resistor can pull down the source terminal to a low signal when the signal is not available. Thus the additional JFET can be closed and the current valve opened should the signal drop out. This can achieve an additional safeguard against a fault in the production or transfer of the signal.

In a second variant, which can be combined with the first variant, a high potential of the supply voltage is connected to the source terminal of the additional JFET, and a series circuit composed of a resistor and a Zener diode is taken to a low potential of the supply voltage. The gate terminal of the additional JFET is connected to a point between the resistor and the Zener diode.

A signal for controlling the additional JFET can be produced very simply by the voltage divider formed from the Zener diode and the resistor. In normal operation, when there is no voltage fault at the supply voltage, a negative control voltage is dropped across the resistor and the Zener diode. The Zener diode has a suitable trigger threshold to make the voltage across the resistor sufficiently high for the additional JFET to be safely open.

A supply voltage of −20V shall be considered as an example. Say, for instance, the Zener diode clamps at 10 V. Then there is also a 10 V drop across the resistor, and the control voltage at the gate terminal of the additional JFET equals −10V, ensuring the off state. If the supply voltage now drops (at any gradient), then initially only the voltage dropped across the resistor is reduced, and the Zener diode continues to clamp at 10V. If the voltage at the resistor exceeds the threshold voltage of the additional JFET, this closes and connects the capacitor to the source terminal of the current valve, resulting in a voltage between the gate terminal and the source terminal of the current valve that safely opens the current valve.

According to a further aspect of the present disclosure, an inverter for driving an electrical machine comprises an output stage as described herein. The output stage can comprise one or more half-bridges, and a half-bridge can comprise one or more current valves. As an option, the output stage also comprises the driver for driving the current valves. In addition, the inverter can comprise a DC-link capacitor for decoupling a DC voltage at which a half-bridge can be operated. The inverter can also comprise a cooling system having a fluid channel, in which a fluid can be moved in order to transport heat away from a current valve, from a half-bridge or from the DC-link capacitor.

The inverter is configured to provide one or more AC voltages on the basis of a DC voltage, which in particular can be provided by a rechargeable battery or another portable energy source. For use on board a motor vehicle, the DC voltage typically equals approximately 400 V, approximately 800 V or approximately 900 V, although other voltages are also possible. It is also preferred that the AC voltages are coordinated with one another such that they can be used to drive an electrical machine, for example a permanent magnet synchronous machine. In an embodiment, the inverter is configured to provide the AC voltages according to a control signal. The control signal can comprise a torque to be provided by the machine and/or a rotational speed to be adopted by the machine. In other words, the driver can perform open-loop or closed-loop vector control of the electrical machine. The electrical machine is also preferably configured for propulsion of a motor vehicle.

According to yet another aspect of the present disclosure, an electric axle-drive for a motor vehicle comprises an inverter as described herein. The axle drive can comprise a fixed or shiftable transmission in order to transfer a rotational movement of the electrical machine to a drive wheel of the motor vehicle. The axle drive can be configured to be driven by a further drive machine, in particular an internal combustion engine. Torques from the electrical machine and the further drive machine can be coupled together appropriately.

According to a further aspect of the present disclosure, a motor vehicle comprises an electric axle-drive as described herein. The motor vehicle preferably comprises an automobile, but can also comprise a motorcycle, a truck or a bus.

The present disclosure is now described in greater detail with reference to the accompanying figures.

DETAILED DESCRIPTION

Figure 1:
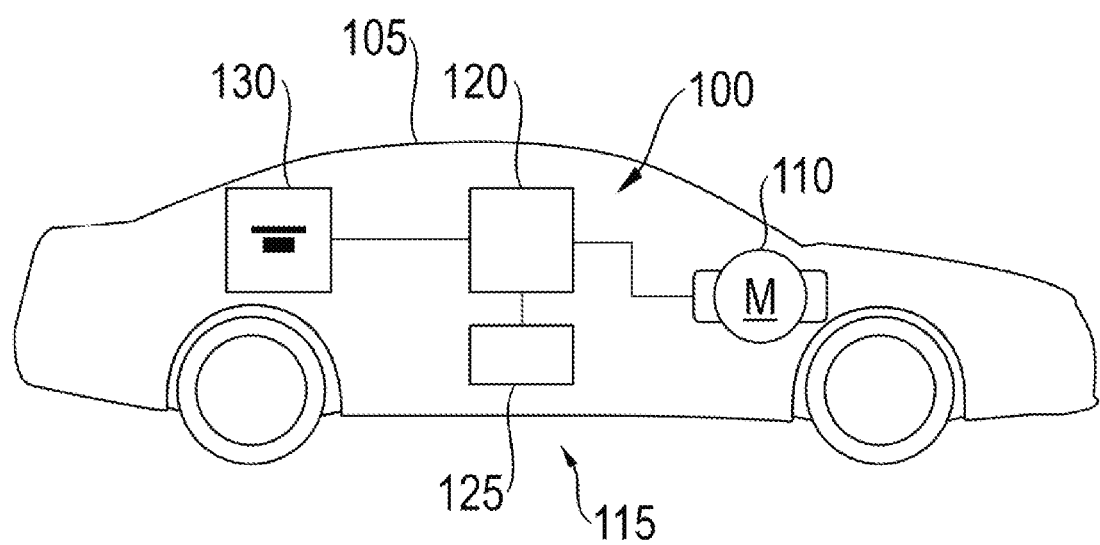
FIG. 1 shows a motor vehicle.

FIG. 1 shows an electric axle-drive 100 on board a motor vehicle 105. The axle drive 100 comprises an electrical drive machine 110 and an inverter 115, which comprises an output stage 120 and a driver 125. On board the motor vehicle 105 is provided an electrical energy store 130, which can comprise in particular a rechargeable battery.

FIG. 1 does not show an optional transmission between the electrical drive machine 110 and a drive wheel of the motor vehicle 105. A further drive motor, which can also be coupled to a drive wheel, is optionally provided on board the motor vehicle 105.

The inverter 115 is preferably configured to produce on the basis of a DC voltage provided by the energy store 130, and to provide to the drive machine 110, a plurality of phase-offset AC voltages. The providing is preferably performed according to a demand signal, which can be provided by a driver of the motor vehicle 105.

Figure 2:
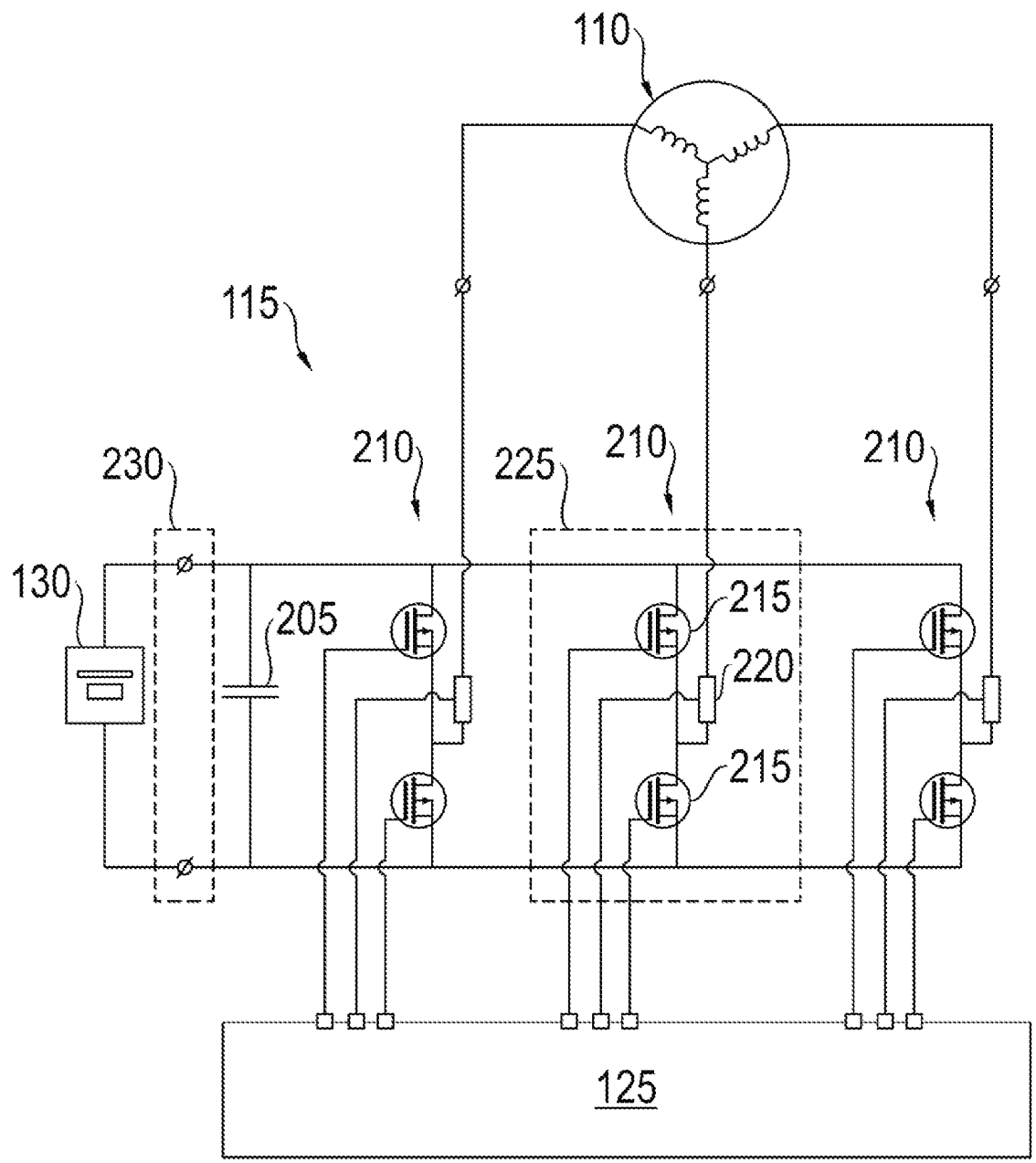
FIG. 2 shows a circuit diagram of an inverter.

FIG. 2 shows a circuit diagram of an inverter 115 in an exemplary embodiment. The inverter 115 is connected to an energy store 130 and comprises, for example, a DC-link capacitor 205, three half-bridges 210, each containing a first ("high-side", shown at the top) and a second ("low-side", shown at the bottom) current valve 215, and the driver 125. The current valves 215 are each embodied as JFETs, preferably in SiC technology. Two current valves 215 of a half-bridge 210 can be comprised by a control module 225.

A gate terminal G, a drain terminal D and a source terminal S are labeled on one of the current valves 215 by way of example in accordance with standard conventions. Two current valves 215 of a half-bridge 210 are connected in series, with the source terminal of the high-side current valve 215 being connected to the drain terminal of the low-side current valve 215. The connection between the two terminals is taken out in order to be connected to a phase of the electrical machine 110. The current is fed here by way of example through a resistor 220, resulting in a voltage drop across this resistor that is proportional to the current flowing through this phase of the electrical machine 110. This voltage can be evaluated by the driver 125. Other methods for measuring the current are equally possible.

The drain terminal of the high-side current valve 215 is connected to a high potential, and the source terminal of the low-side current valve 215 is connected to a low potential of the energy store 130. The DC-link capacitor 205 is connected in parallel with the energy store 130.

The driver 125 provides control voltages to the total of six current valves 215 in order to produce a predetermined voltage at each of the phases of the electrical machine 110. Since a current valve 215 is closed in the absence of a drive, it must be opened actively by providing a suitable control voltage. The driver 125 is operated by a supply voltage that can be provided from the energy store 130 or another source. Should the supply voltage fail or drop below a predetermined minimum, the driver 125 can no longer work correctly, and in particular cannot prevent both current valves 215 of a half-bridge 210 being closed at the same time and thus the possibility of a short circuit occurring across the energy store 130.

It is usual to provide a protective device 230 for disconnecting the energy store 130 from the inverter 115, but this can require a certain trip time. To prevent a short circuit, it is proposed to provide a cutout circuit at a current valve 215 of a half-bridge 210, which opens, and keeps open over a predetermined time, the current valve 215 when the supply voltage drops or fails.

Figure 3:
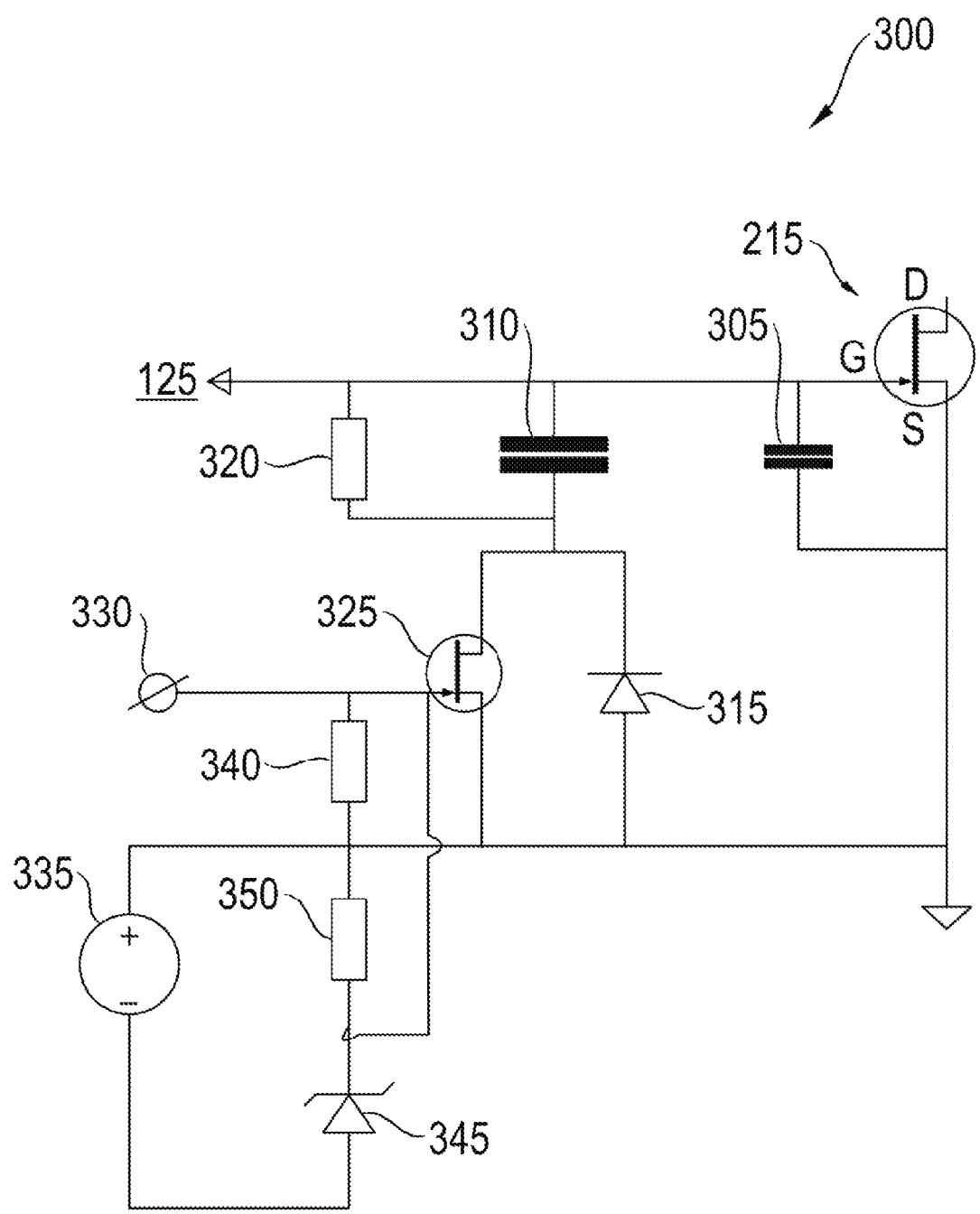
FIG. 3 shows a circuit diagram of a cutout circuit.

FIG. 3 shows a cutout circuit 300 for safeguarding a current valve 215. The gate terminal of the current valve 215 is connected to the driver 125. A capacitance 305 of the JFET 215 acts between the gate terminal and the source terminal of the current valve 215. In parallel with the capacitance 305 are connected a capacitor 310 and a diode 315, where a cathode of the diode 315 faces towards the capacitor 310. A resistor 320 is optionally connected in parallel with the capacitor 310.

An additional JFET 325 is connected in parallel with the diode 315, with a drain terminal being connected to the cathode, and a source terminal to the anode of the diode 315. The gate terminal of the additional JFET 325 is connected to an interface 330 by way of example. The source terminal of the additional JFET 325 is here also connected to a high potential of a voltage supply 335, which provides a supply voltage for the driver 125.

If the gate terminal of the additional JFET 325 is connected to a suitable potential then the JFET 325 opens and the capacitor 310 is prevented from discharging if the drive 125 changes level. The diode 315 allows the capacitor 310 to charge via the drive by the driver 125 and prevents the capacitor 310 from discharging when the additional JFET 325 is closed. If the signal is removed from the gate terminal or connected to a complementary signal, the JFET 325 closes and therefore the charged capacitor 310 appears at the current valve 215 between gate terminal and source terminal. The current valve 215 is opened by the capacitor voltage, and current is prevented from flowing through the current valve 215 from the drain terminal to the source terminal.

In an embodiment, the interface 330 is connected to a source for a suitable shutdown signal, for example to a monitoring terminal of a control module 225 that comprises the current valve 215. The signal can become active if the supply voltage drops below a predetermined threshold value. The signal can have hysteresis so that it is not deactivated again until the supply voltage rises above a second threshold value, which is higher than the first threshold value. A resistor 340 between the interface 330 and the source terminal of the additional JFET 325 can ensure that the JFET 325 is closed when no signal is present at the interface 330.

An optional circuit, which is shown in FIG. 3, can generate a suitable signal at the interface 330. For this purpose, a Zener diode 345 and a resistor 350 are connected in series with the supply voltage of the voltage supply 335. The anode of the Zener diode 345 is at the negative potential of the voltage supply 335. The connection between the cathode of the Zener diode 345 and the resistor 350 is connected to the interface 330.

If there is no voltage fault at the supply voltage, the negative supply voltage is dropped across the resistor 350 and the Zener diode 345. The Zener diode 345 has a suitable breakdown voltage to make the voltage across the resistor 350 sufficiently high in this case to hold the additional JFET 325 open securely. For example, the supply voltage can equal approximately −20 V. The Zener diode 345 has here an example breakdown voltage of approximately 10 V. Thus, there is also a 10 V drop across the resistor 350, and the drive voltage of the additional JFET 325 equals −10V, with the result that the additional JFET 325 is open. The current valve 215 can be controlled freely by the driver 125.

If the supply voltage then drops, the driver 125 can no longer drive, and in particular no longer open, the current valve 215. The drop initially causes a reduction only in the voltage that is dropped across the resistor 350, because the Zener diode 345 continues to clamp at a predetermined voltage of 10 V here, which is dropped across the Zener diode 345. If the voltage at the resistor 350 falls below the threshold voltage of the additional JFET 325, the capacitor 310 is switched to the gate terminal of the current valve 215, with the result that the current valve 215 is open. The current valve 215 can be prevented from closing until the capacitor 310 is discharged.

The resistor 320 can cause the current valve 215 to be closed very slowly from the safely off state by it discharging the capacitor 310 in a controlled manner. This preferably takes place at a time at which the energy store 130 is already disconnected safely from the inverter 115 by an apparatus such as the protective device 230. By virtue of the gradual closure of the current valve 215, the DC-link capacitor 205 can be discharged, and the energy stored therein can be converted into heat at the current valve 215.

If the supply voltage rises again, the additional JFET 325 can open again, thereby terminating the safe shutdown of the current valve 215 and allowing the driver 125 to control the current valve 215 freely.

REFERENCE SIGNS

- 100 axle drive
- 105 motor vehicle
- 110 electrical drive machine
- 115 inverter
- 120 output stage
- 125 driver
- 130 energy store
- 205 DC-link capacitor
- 210 half-bridge
- 215 current valve
- 220 resistor, current sensor
- 225 control module
- 230 protective device
- D drain terminal
- G gate terminal
- S source terminal
- 300 cutout circuit
- 305 GS capacitance
- 310 capacitor
- 315 diode
- 320 resistor
- 325 additional JFET
- 330 interface
- 335 voltage supply
- 340 resistor
- 345 Zener diode
- 350 resistor

The invention claimed is:

1. An output stage for an inverter for driving an electrical machine, the output stage comprising:
    a half-bridge containing a current valve embodied as a JFET, wherein the current valve is configured to be controlled by a driver;
    a cutout circuit configured to open the current valve when the driver has no supply voltage, wherein the cutout circuit comprises:
        a capacitor and a diode connected in series between a gate terminal and a source terminal of the current valve;
        an additional JFET configured to bypass the diode; and
        a drive configured to keep a voltage between a gate terminal and a source terminal of the additional JFET low enough to close the additional JFET as long as a supply voltage of the driver is above a predetermined threshold value.

2. The output stage as claimed in claim 1, wherein the current valve can be closed by a negative voltage at its gate terminal.

3. The output stage as claimed in claim 1, wherein the current valve comprises silicon carbide.

4. The output stage as claimed in claim 1, comprising:
    a resistor provided in parallel with the capacitor to close the current valve slowly when the capacitor has discharged by a predetermined amount.

5. The output stage as claimed in claim 1, wherein the drive is performed on the basis of a signal that indicates a sufficient supply voltage of the driver.

6. The output stage as claimed in claim 5, wherein the current valve comprises a control module that is configured to provide the signal.

7. The output stage as claimed in claim 5, comprising:
    an interface for the signal, wherein the interface is taken to a source terminal of the current valve by a resistor.

8. The output stage as claimed in claim 1, wherein a high potential of the supply voltage is connected to the source terminal of the additional JFET, and a series circuit comprising a second resistor and a Zener diode is taken to a low potential of the supply voltage, and
    wherein the gate terminal of the additional JFET is connected between the second resistor and the Zener diode.

9. An inverter for driving an electrical machine, comprising:
    the output stage as claimed in claim 1.

10. An electric axle-drive for a motor vehicle, comprising: the inverter as claimed in claim 9.

11. A motor vehicle, comprising:
    the electric axle-drive as claimed in claim 10.

* * * * *